(12) United States Patent  
Tanaka

(10) Patent No.: US 6,301,182 B1  
(45) Date of Patent: Oct. 9, 2001

(54) SEMICONDUCTOR MEMORY DEVICE

(75) Inventor: Ryuji Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/532,874

(22) Filed: Mar. 22, 2000

(30) Foreign Application Priority Data

Aug. 2, 1999 (JP) .................................................. 11-219188

(51) Int. Cl.[7] ........................... G11C 7/00; G01R 31/317
(52) U.S. Cl. ........................ 365/221; 365/219; 365/201; 714/718
(58) Field of Search ................................. 365/219, 221, 365/201; 714/718

(56) References Cited

U.S. PATENT DOCUMENTS

| | | | |
|---|---|---|---|
| 5,299,432 | * | 4/1994 | Nakae et al. ............................ 62/298 |
| 5,506,804 | * | 4/1996 | Yanagisawa et al. ........... 365/189.11 |
| 5,862,146 | | 1/1999 | Chen et al. . |

FOREIGN PATENT DOCUMENTS

| | | |
|---|---|---|
| 61-144800 | 7/1986 | (JP) . |
| 402057988A * | 2/1990 | (JP) . |
| 02082174 * | 3/1990 | (JP) . |
| 411014709 * | 1/1999 | (JP) . |
| WO 98/41990 | 9/1998 | (WO) . |

OTHER PUBLICATIONS

European Search Report dated Feb. 8, 2001.

* cited by examiner

Primary Examiner—Viet Q. Nguyen
(74) Attorney, Agent, or Firm—Arent, Fox, Kintner, Plotkin & Kahn, PLLC

(57) ABSTRACT

A semiconductor memory includes a memory having a plurality of input/output terminals for inputting/outputting parallel data: a parallel/serial conversion circuit connected to said parallel terminals of said memory so as to convert said parallel data of said memory into serial data and input/output the serial data; a plurality of test terminals connected to said parallel terminals of said memory, respectively; and a switch control circuit arranged between said parallel terminals of said memory and said parallel/serial conversion circuit, for disabling said parallel/serial conversion circuit.

8 Claims, 6 Drawing Sheets

FIG. 1 RPIOR ART

FIG. 2 RPIOR ART

SEMICONDUCTOR MEMORY DEVICE

BACKGROUND OF THE INVENTION

1. Field of the Invention

The present invention generally relates to semiconductor memory devices, and more particularly to a semiconductor memory device that comprises one or a plurality of parallel semiconductor memories which simultaneously input or output data with a plurality of bits, and a controller which serves to perform a parallel/serial conversion.

2. Description of the Related Art

Conventionally, a small-sized memory card usually has a bus width the same as or several times wider than a memory (memories) provided on the memory card does (do). Mostly, the memory card simultaneously inputs and outputs data with a plurality of bits, that is, the memory card performs a parallel operation with respect to the inputting/outputting of the data.

FIG. 1 shows an example of the conventional parallel memory card. As shown in this diagram, the conventional parallel memory card comprises a memory 101 and a printed substrate 102 on which the memory 101 is provided.

The memory 101 has a plurality of data inputting-and-outputting terminals D1 through Dn and a control terminal CTRL consisting of a plurality of control signals of the memory 101, for example, consisting of a clock signal, a data-direction-determining signal. The printed substrate 102 has a plurality of data inputting-and-outputting terminals 104-1 through 104-n and a control terminal 103 consisting of a plurality of control signals of the printed substrate 102.

The plurality of data inputting-and-outputting terminals 104-1 through 104-n are coupled to the plurality of data inputting-and-outputting terminals D1 through Dn, respectively. The control terminal CTRL of the memory 101 is coupled to the control terminal 103 of the printed substrate 102.

A host reads/writes data from/into the memory 101 via the data inputting-and-outputting terminals 104-1 through 104-n and the control terminal 103.

In recent years, with increasing demand for miniaturization of the memory card, the memory cards have been downsized more and more. In order to support this situation, a memory card that operates serially is provided. Such a serial memory card comprises a memory operating parallel and a controller serving to perform a parallel/serial conversion. Since the serial memory card communicates serially with the host, the number of the memory card can be reduced and as a result the memory card can be further downsized.

FIG. 2 is a diagram showing an example of the conventional memory card operating serially.

As can be seen from FIG. 2, the serial memory card comprises the memory 101, the printed substrate 102 and a controller 201.

The controller 201 includes a parallel/serial conversion circuit 202 and an input-and-output control circuit 203. The parallel/serial conversion circuit 202 has a plurality of parallel terminals coupled to the respective data inputting-and-outputting terminals D1 through Dn. Also, The parallel/serial conversion circuit 202 has a serial terminal coupled to a serial terminal 205 of the printed substrate 102.

The host sends a control signal 204 to the control terminal CTRL of the memory 101 via the input-and-output control circuit 203 of the controller 202. Also, the host writes/reads data into/from the memory 101 installed on the memory card according to a serial control protocol of the controller 201.

However, in a case of a test for the serial memory card in production thereof, the test has to be performed by serially writing/reading data into/from the serial memory card as previously described. This case brings about a problem that test time is increased and as a result test cost is increased as well, because if the serial memory card having a memory with a data width of 8 bits, the test time thereof is 8 times as long as that of a parallel memory card having the same memory.

SUMMARY OF THE INVENTION

It is a general object of the present invention to provide a semiconductor memory, in which the above problem can be eliminated and for which test time can be reduced.

Another and a more specific object of the present invention is to provide a semiconductor memory, said voltage raising circuit comprising:

a plurality of input/output parallel terminals for inputting/outputting test data.

Still another object of the present invention is to provide a semiconductor memory comprising:

a memory having a plurality of input/output terminals for inputting/outputting parallel data;

a parallel/serial conversion circuit connected to said parallel terminals of said memory so as to perform parallel/serial conversion and input/output serial data;

a plurality of test terminals connected to said parallel terminals of said memory, respectively; and a switch control circuit arranged between said parallel terminals of said memory and said parallel/serial conversion circuit, for switching said parallel/serial conversion circuit off.

Still another object of the present invention is to provide a semiconductor memory comprising:

a memory having a plurality of input/output terminals for inputting/outputting parallel data;

a parallel/serial conversion circuit connected to said parallel terminals of said memory so as to perform parallel/serial conversion and input/output serial data;

a plurality of test terminals; and a switch control circuit arranged between said parallel terminals of said memory and said parallel/serial conversion circuit, for switching said parallel/serial conversion circuit off so as to input/output data between said test terminals and said memory, or switching said parallel/serial conversion circuit on so as to input/output data between said memory and said parallel/serial conversion circuit.

Other objects, features and advantages of the present invention will become more apparent from the following detailed description when read in conjunction with the accompanying drawings.

DETAILED DESCRIPTION OF THE PREFERRED EMBODIMENTS

With reference to the drawings, a description will be given below of preferred embodiments of the present invention.

Figure 1:
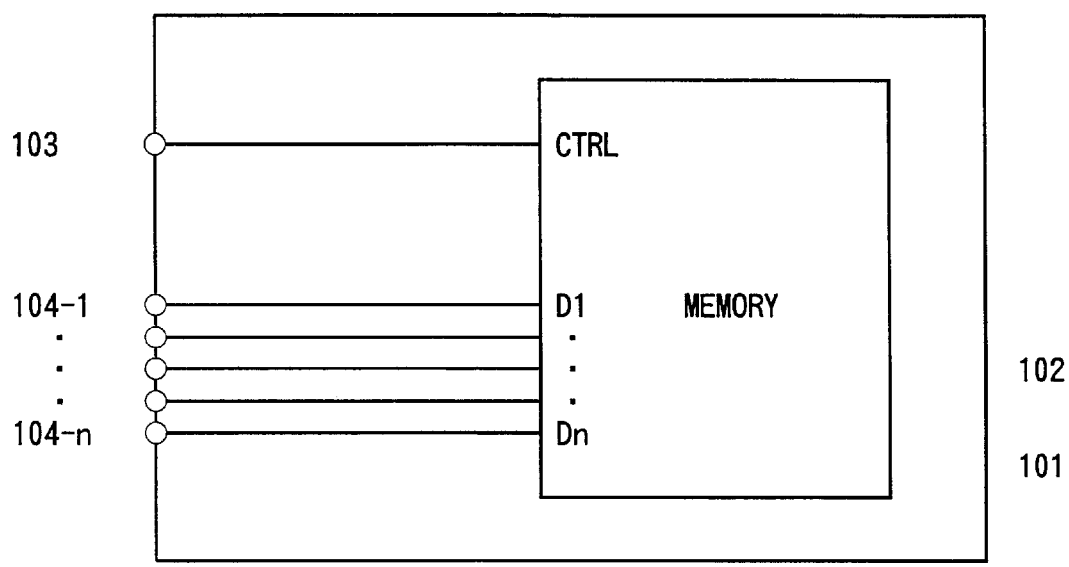
FIG. 1 is a diagram showing an example of a conventional parallel memory card.
Figure 2:
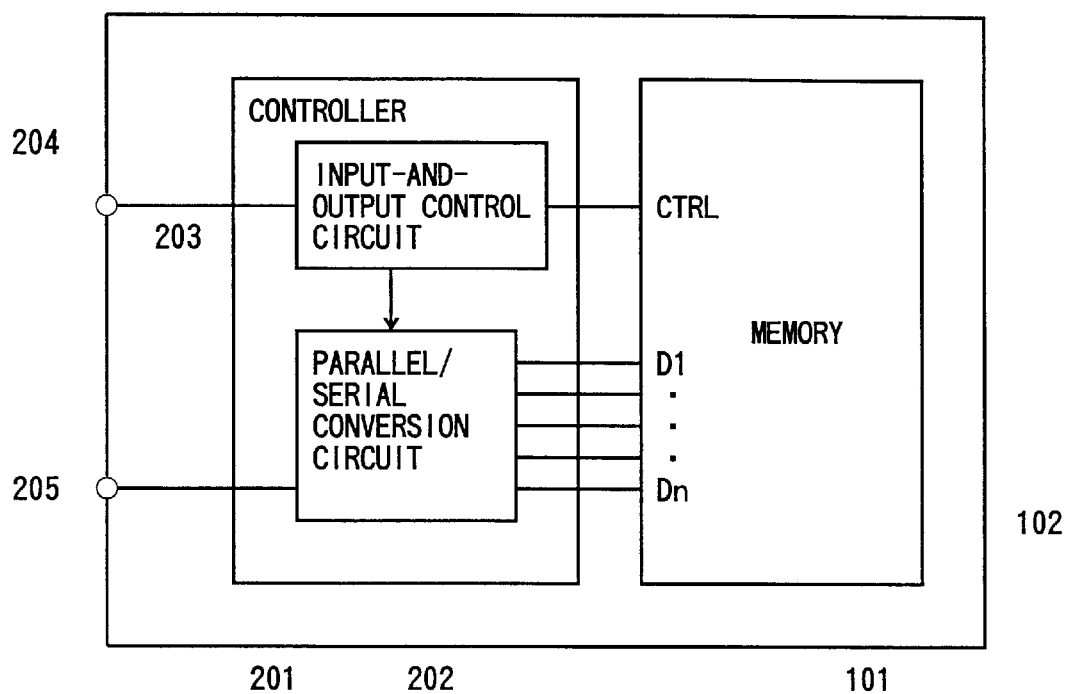
FIG. 2 is a diagram showing an example of a conventional serial memory card.
Figure 3:
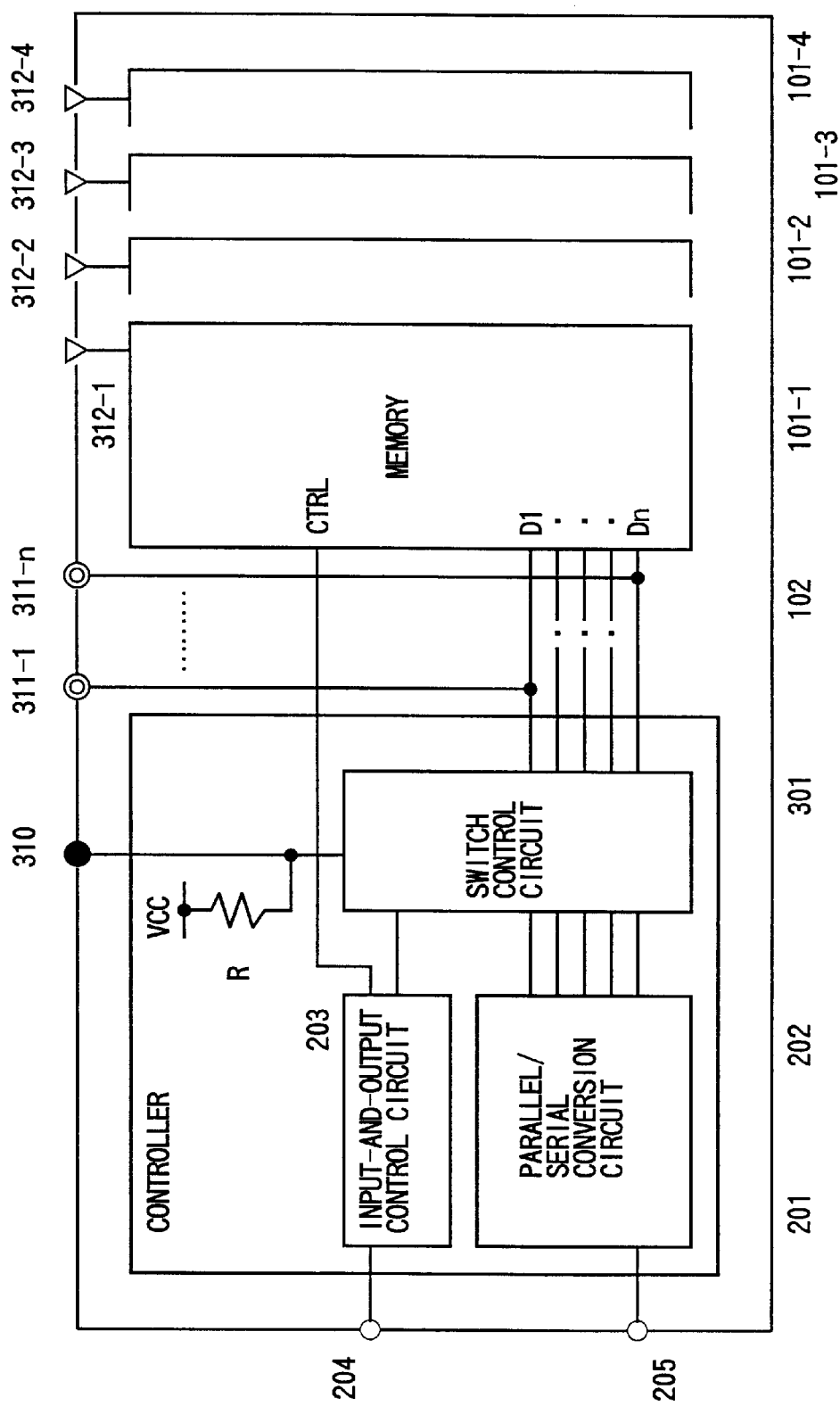
FIG. 3 is a diagram showing an entire configuration of a memory card of a first embodiment according to the present invention.

FIG. 3 shows an entire configuration of a memory card of a first embodiment. In this embodiment, the memory card is provided with a plurality of memories installed therein. As shown in FIG. 3, the memory card comprises parallel memories 101-1 through 101-4, a printed substrate 102, and a controller 201.

Specifically, the parallel memories 101-1 through 101-4 each have a plurality of data inputting-and-outputting terminals D1 through Dn and a control terminal CTRL. The printed substrate 102 has a serial data inputting-and-outputting terminal 205. The controller 201 includes a parallel/serial conversion circuit 202, an input-and-output control circuit 203, a switch control circuit 301 and an inside resistance R.

The parallel/serial conversion circuit 202 has a plurality of parallel terminals, which are coupled, via the switch control circuit 301, to the plurality of data inputting-and-outputting terminals D1 through Dn of the memory 101, respectively. Also, the parallel/serial conversion circuit 202 has a serial terminal, which is coupled to the serial data inputting-and-outputting terminal 205 of the printed substrate 102.

A signal 204 from a host is sent to the input-and-output control circuit 203, which serves to forward the signal 204 to both a control terminal CTRL of the memory 101 and the switch control circuit 301.

In addition, the printed substrate 102 includes a control terminal 310, a plurality of test terminals 311-1 through 311-n, and a plurality of selection-signal inputting terminals 312-1 through 312-4.

The control terminal 310 is only used when the memory card is to be tested and serves to input a control signal into the switch control circuit 301. The test terminals 311-1 through 311-n are coupled to data buses of the respective memories 101-1 through 101-4. The selection-signal inputting terminals 312-1 through 312-4 serve to input selection signals so as to make a selection from the memories 101-1 through 101-4. In addition, the control terminal 310 is connected to a terminal of the controller 201, and the terminal of the controller 201 is connected, via the resistance R, to a power source VCC.

As shown in FIG. 3, serial data is inputted from the inputting-and-outputting terminal 205 into the parallel/serial conversion circuit 202, where the serial data is converted into parallel data and then the parallel data is outputted into the parallel terminals D1 through Dn of the memory 101 via the switch control circuit 301. On the other hand, parallel data from the parallel terminals D1 through Dn of the memory 101 is outputted, via the switch control circuit 301, into the parallel/serial conversion circuit 202, where thereof. When the control terminals 405 and 406 become low, on the other hand, the three-state buffers 403 and 404 become high impedance.

In the case of the test mode, all of the terminals, including the test terminals, of the memory card are coupled to a testing apparatus.

First, the testing apparatus causes the control terminal 310 to be at the low level so as to input a control signal into the switch control circuit 301. When the control terminal 310 becomes low, an output of the AND gate 401 becomes low regardless of an output signal from the input-and-output control circuit 203 and then an output of the inverter 402 becomes high. Thereby, the control terminal 406 of the buffer 404 becomes low and an output of the buffer 404 becomes high impedance.

Second, the testing apparatus sends the terminals 312-1 through 312-4 selection signals for making a selection from the memories 101-1 through 101-4 so as to determine which memory is to be tested. After that, the test is performed by directly and parallel inputting/outputting data into/from the memories 101-1 through 101-4 via the test terminals 311-1 through 311-n.

In the case where the operation mode, on the other hand, the control terminal 310 is inputted a signal at the high level, or is kept in a state of high impedance. Thereby, an output of the AND gate 401 operates according to an output signal from the input-and-output control circuit 203 so that the buffers 403 and 404 are controlled. Thus, the host can write/read data into/from the memory 101 installed on the memory card according to the serial control protocol of the controller 201.

In addition, the previously described control signal for switching into the test mode, the data inputting-and-outputting terminals 311-1 the parallel data is converted into serial data and then the serial data is outputted from the inputting-and-outputting terminal 205.

In this embodiment, the memory card has two modes: an operation mode and a test mode.

In the case of the operation mode, the control terminal 310 is inputted a signal at the high level or is kept in a state of high impedance. Thus, the host can writes/reads data into/from the memory 101 installed on the memory card according to a serial control protocol of the controller 201.

In a case where the test mode, on the other hand, the control terminal 310 is inputted a signal at the low level.

Next, a detailed description is given below with respect to the test mode of the memory card.

Figure 4:
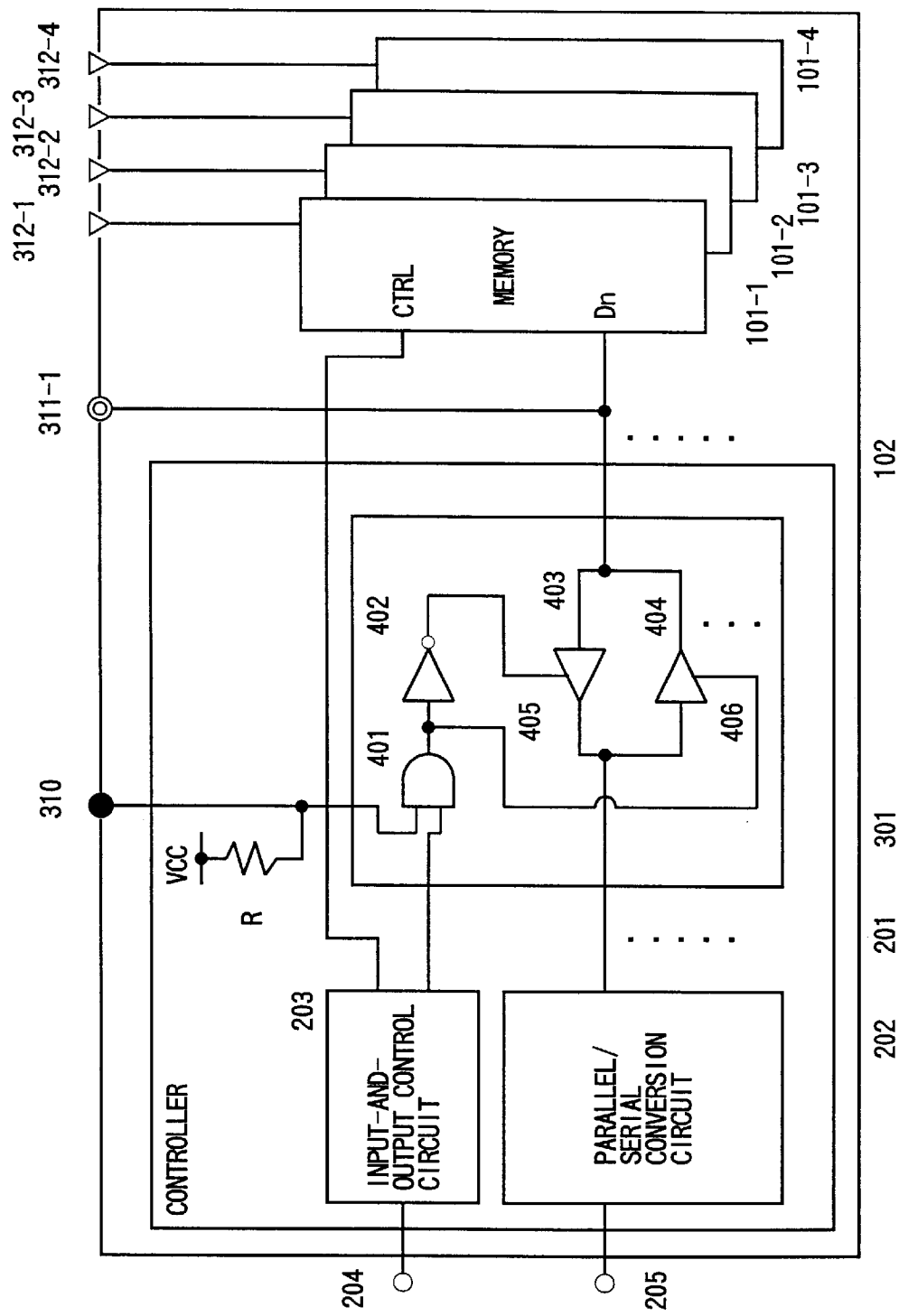
FIG. 4 is a diagram showing the memory card of FIG. 3, putting an emphasis on a switch control circuit therein.

FIG. 4 shows the memory card of the first embodiment of FIG. 3, putting an emphasis on the switch control circuit 301. In this diagram, in order to give an easy understanding of the memory card of FIG. 3, only that one of the plurality of parallel terminals is connected, via the switch control circuit 301, to the data inputting-and-outputting terminal Dn of the memory 101-1 is shown.

Also, in FIG. 4, parts, which are the same as those in FIG. 3, are given the same reference numerals.

As can be seen from FIG. 4, the switch control circuit 301 includes an AND gate 401, an inverters 402, and two three-state buffers 403 and 404. The three-state buffer 403 has a control terminal 405 and the three-state buffer 404 has a control terminal 406. When the control terminals 405 and 406 thereof becomes high, the two three-state buffers 403 and 404 become low impedance and an input signal can outputted from output terminals through 311-n, and the like are only used in the test. The memory card of the present invention is finally completed by using a case made up of resin or the like to cover the printed substrate, where the control terminal 310 connected via the resistance R to the power source VCC is always kept at the high level so as to avoid the memory card moving to the test mode.

In addition, in this embodiment, the memory card is designed to be in the test mode in the case where the control terminal 310 becomes low. However, an inverter may be provided between the control terminal 310 of the switch control circuit 301 and an input terminal of the AND gate 401. If so, the memory card may be in the test mode in the case where the control terminal 310 becomes high. In this case, the terminal of the controller 201, to which the control terminal 310 is connected, is connected via the inside resistance R to the ground.

Next, a description is given below with respect to a second embodiment of the present invention.

Figure 5:
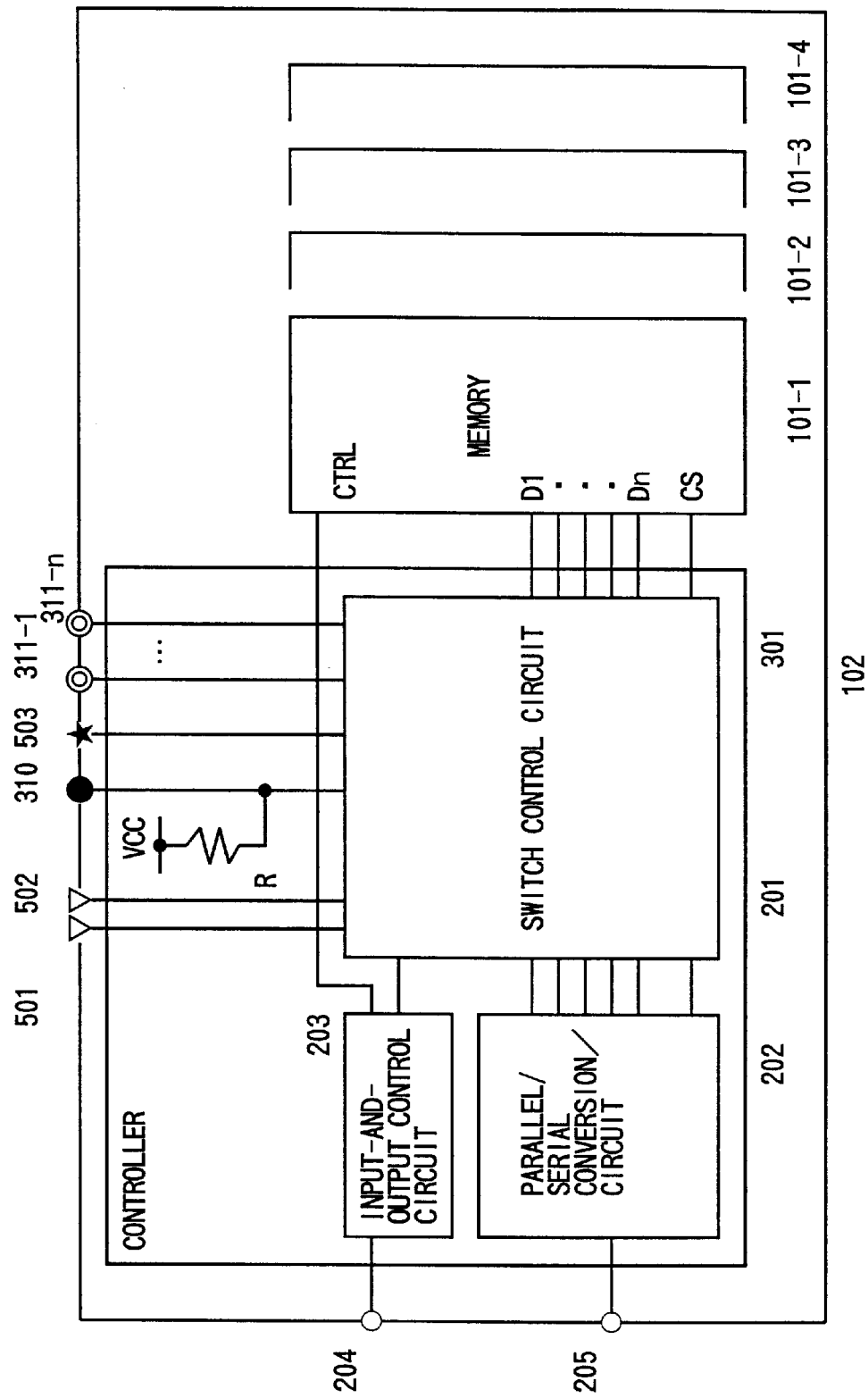
FIG. 5 is a diagram showing an entire configuration of a memory card of a second embodiment according to the present invention.

FIG. 5 shows an entire configuration of a memory card of the second embodiment.

As shown in this diagram, the memory card comprises the parallel memories 101-1 through 101-4, the controller 201, and the printed substrate 102.

The controller 201 includes the parallel/serial conversion circuit 202, the input-and-output control circuit 203 and the switch control circuit 301.

In the second embodiment, the memory card also has two modes: an operation mode and a test mode.

Unlike the first embodiment shown in FIGS. 3 and 4, in the second embodiment, the test terminals 311-1 through 311-n, which are used for testing the memory card, are coupled to the switch control circuit 301. According to this configuration of the second embodiment, within the switch control circuit 301, the control terminal 310 switch an input/output signal of the test terminals 311-1 through 311-n in the case of the test mode into an input/output signal of the parallel/serial conversion circuit 202 in the case of the operation mode.

Further, unlike the first embodiment where the input terminals 312-1 through 312-4 are used for making the selection from the memory 101-1 through 101-4, in the second embodiment, the memory card is provided with two memory selecting terminals 501 and 502 and a test input/output switch terminal 503.

In other words, in the first embodiment shown by FIG. 3, the test terminals 311-1 through 311-n provided on the printed substrate 102 are directly connected to the memories 101-1 through 101-4, whereas in the second embodiment, even in the case of the test mode, these test terminals 311-1 through 311-n are connected, via the switch control circuit 301, to the memories 101-1 through 101-4.

Figure 6:
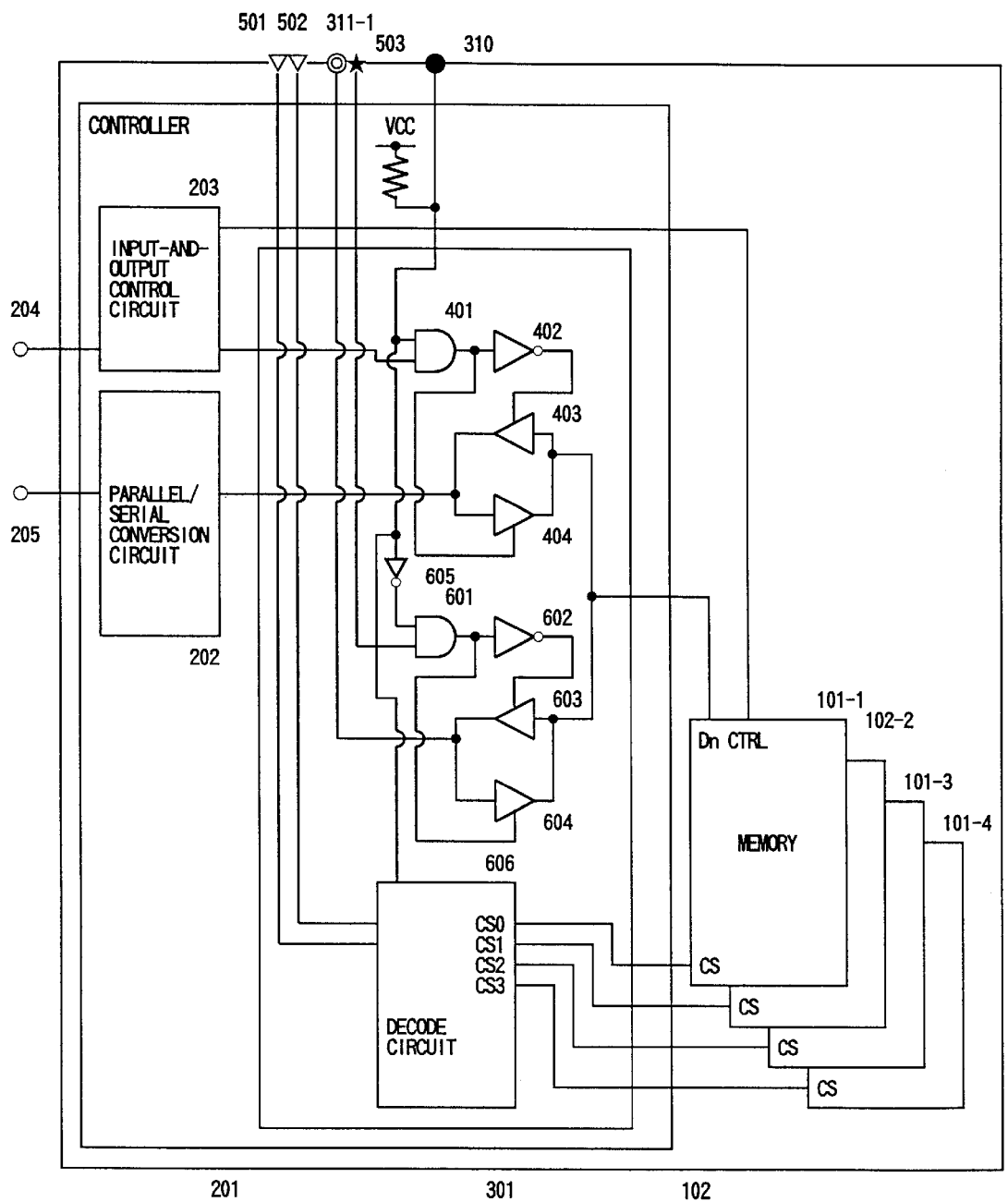
FIG. 6 is a diagram showing the memory card of FIG. 5, putting an emphasis on a switch control circuit therein.

FIG. 6 shows the memory card of FIG. 5, putting an emphasis on the switch control circuit 301. In this diagram, in order to give an easy understanding of the memory card of FIG. 5, only that one of the plurality of parallel terminals is connected, via the switch control circuit 301, to the data inputting-and-outputting terminal Dn of the memory 101-1 is shown.

Also, in FIG. 6, parts, which are the same as those in FIG. 4, are given the same reference numerals.

As can be seen from FIG. 6, the switch control circuit 301 includes an AND gate 601, two inverters 602 and 605, two three-state buffers 603 and 604, and a decode circuit 606.

In the case of the operation mode of the memory card, the control terminal 310 is supplied with an input signal at the high level, or is kept in a state of high impedance. Thereby, an output of the AND gate 401 operates according to an output signal of the input-and-output control circuit 203 so that the buffers 403 and 404 are controlled. When an output of the inverter 605 becomes low, on the other hand, an output of the inverter 602 becomes high. Thereby, a control terminal of the buffer 604 becomes low and an output of the buffer 604 becomes high impedance. As a result, the buffer 604 does not output signals from the test terminals 311-1 through 311-n to the memories 101-1 through 101-4.

Accordingly, the host can write/read data into/from the memory 101 installed on the memory card according to the serial control protocol of the controller 201.

Next, a detailed description is given below with respect to the test mode of the second embodiment.

In the case where a test is performed for the memory card, all of the terminals, including the test terminals, of the memory card are coupled to the testing apparatus.

First, the testing apparatus causes the control terminal 310 to be at the low level and inputs a control signal into the switch control circuit 301. When the control terminal 310 becomes low, an output of the AND gate 401 becomes low regardless of an output signal of the input-and-output control circuit 203 and an output of the inverter 402 becomes high. Thereby, the control terminal 406 of the buffer 404 becomes low and an output of the buffer 404 becomes high impedance. On the other hand, when an output of the inverter 605 becomes high, the buffers 603 and 604 are controlled by a signal inputted by the test input-and-output switch terminal 503 and a data inputting/outputting direction is controlled by the test terminal 311-1.

Second, the testing apparatus supplies the memory selecting terminals 501 and 502 with two selection signals which serve to make a selection from the memories 101-1 through 101-4, and then the memory selecting terminals 501 and 502 forwards the two selection signals to the decode circuit 606. The decode circuit 606 supplies four output terminals CS0, CS1, CS2, and CS3, by which a memory to be tested is selected. After that, the test is performed by parallel inputting-and-outputting data from the test terminals 311-1 through 311-n, via the switch control circuit 301, to the memories 101-1 through 101-4.

In the second embodiment, since the test terminals 311-1 through 311-n are connected, not directly, via the switch control circuit 301, to the memories 101-1 through 101-4, the memory card has a strong resistance to noise particularly in the operation mode.

Further, by performing the test with the circuits of the present invention, it can be simultaneously tested whether or not lines are connected between the switch control circuit 301 and the memories 101-1 through 101-4.

The above description is provided in order to enable any person skilled in the art to make and use the invention and sets forth the best mode contemplated by the inventor for carrying out their invention.

Although the present invention has been described in terms of various embodiments, it is not intended that the invention be limited to these embodiments. Modification within the spirit of the invention will be apparent to those skilled in the art.

The present application is based on Japanese priority application No. 11-219188 filed on Aug. 2, 1999, the entire contents of which are hereby incorporated by reference.

What is claimed is:

1. A semiconductor memory comprising:
   a memory having a plurality of input/output parallel terminals for inputting/outputting parallel data:
   a parallel/serial conversion circuit connected to said input/output terminals of said memory, said parallel/serial conversion circuit converting the parallel data of said memory into serial data and inputting /outputting the serial data; and
   a plurality of parallel test terminals for inputting/ outputting test data to/from said input/output parallel terminals of said memory.

2. The semiconductor memory as claimed in claim 1, wherein said semiconductor memory is a serial memory card.

3. A semiconductor memory, comprising:

a memory having a plurality of input/output parallel terminals for inputting/outputting parallel data;

a parallel/serial conversion circuit connected to said input/output parallel terminals of said memory, said parallel/serial conversion circuit converting said parallel data of said memory into serial data and inputting/outputting the serial data;

a plurality of parallel test terminals connected to said input/output parallel terminals of said memory, respectively; and a switch control circuit arranged between said input/output parallel terminals of said memory and said parallel/serial conversion circuit, said switch control circuit switching said parallel/serial conversion circuit OFF.

4. The semiconductor memory as claimed in claim 3, wherein said semiconductor memory is a serial memory card.

5. The semiconductor memory as claimed in claim 3, wherein:

said parallel/serial conversion circuit includes a control terminal which is pulled up to a power source or pulled down to the ground; and when said control terminal is released, the input/output of said parallel/serial conversion circuit is enabled.

6. A semiconductor memory, comprising:

a memory having a plurality of input/output parallel terminals for inputting/outputting parallel data;

a parallel/serial conversion circuit connected to said input/output parallel terminals of said memory, said parallel/serial conversion circuit converting said parallel data of said memory into serial data and inputting/outputting the serial data;

a plurality of parallel test terminals; and a switch control circuit arranged between said input/output parallel terminals of said memory and said parallel/serial conversion circuit, said switch control circuit switching said parallel/serial conversion circuit OFF so as to input/output data between said parallel test terminal and said input/output parallel terminals of said memory or switching said parallel/serial conversion circuit ON so as to input/output data between said input/output parallel terminals of said memory and said parallel/serial conversion circuit.

7. The semiconductor memory as claimed in claim 6, wherein said semiconductor memory is a serial memory card.

8. The semiconductor memory as claimed in claim 6, wherein:

said parallel/serial conversion circuit includes a control terminal which is pulled up to a power source or pulled down to the ground; and when said control terminal is released, the input/output of said parallel/serial conversion circuit is enabled.

* * * * *